United States Patent [19]
Brown et al.

[11] Patent Number: 6,116,494
[45] Date of Patent: Sep. 12, 2000

[54] METHOD FOR RE-ATTACHMENT OF A SMT COMPONENT USING A HEATED AIR JET

[75] Inventors: Paul I. Brown, Elk Grove; Natalia Balingit, Antelope, both of Calif.

[73] Assignee: Hewlett-Packard Company, Palo Alto, Calif.

[21] Appl. No.: 09/144,656

[22] Filed: Sep. 1, 1998

[51] Int. Cl.[7] .............................. B23K 31/00; B23K 31/02
[52] U.S. Cl. ...................................... 228/119; 228/180.22
[58] Field of Search .............................. 228/119, 180.22, 228/9, 44.3, 45, 179.1, 180.21

[56] References Cited

U.S. PATENT DOCUMENTS

| | | | |
|---|---|---|---|
| 4,696,096 | 9/1987 | Green et al. | 29/829 |
| 4,752,025 | 6/1988 | Stach et al. | 228/9 |
| 5,376,403 | 12/1994 | Capote et al. | 427/96 |
| 5,511,306 | 4/1996 | Denton et al. | 29/840 |

OTHER PUBLICATIONS

Dyamant Industrie—Laser Serie 100 Support Materials Organization Owner's Manual—Manufacture's version, Jun. 1993, 13 unnumbered pages.

Eric Mouton, Laser!! For Repair, Oct. 1991, 8 unnumbered pages.

COM–KYL Inc. Product Catalog, 5 unnumbered pages.

*Primary Examiner*—Patrick Ryan
*Assistant Examiner*—Cecilia Newsome
*Attorney, Agent, or Firm*—Denise A. Lee

[57] ABSTRACT

The present invention provides an efficient method for attaching computer system components which greatly reduces or eliminates damage to the PC board or components. The method for attaching the computer component includes the steps of: positioning the component on the PC board so that the component leads are aligned with the corresponding pads on the PC board; attaching the anchoring leads to its corresponding pads on the PC board; and heating the attachment media with a heated air jet so that the heated air jet heats the attachment media to a temperature between the melting point of the attachment media and the vaporization point of the attachment media, wherein the heated air jet is moved back and forth along the edge of the component being attached.

9 Claims, 7 Drawing Sheets

METHOD FOR RE-ATTACHMENT OF A SMT COMPONENT USING A HEATED AIR JET

BACKGROUND OF THE INVENTION

Printed circuit boards are becoming increasingly complex with an increasing number of components and interconnections. If a single part on the board becomes defective, it is often more cost effective to rework the board by replacing the damaged component(s) instead of replacing the entire board. In order to provide a quality reworked board, the component must be removed and reattached to the PC board without damaging the PC board or nearby components.

A past solution used for both removal and attachment of integrated circuit components on a printed circuit (PC) board is a laser rework station, such as the Laser Series 100 SMT Rework Station. Using a rework station, a PC board is placed inside the rework station and the area on the board where the component is to be attached or removed is defined by the rework station technician. To attach a component, a laser beam emanating from the rework station is focused on the package perimeter, repetitively moving around the perimeter of the component in the vicinity of the leads, until a temperature above the solder melting point is reached, thereby attaching the component leads to the PC board.

One problem with the laser rework station is its expense. Prices for the laser rework station typically run in the hundreds of thousands of dollars. Because of this relatively high cost, it is prohibitive to have a rework station at the work area of each rework technician. Frequently, a rework floor will own only one rework machine because of its expense. Further, because of their complexity, rework stations are often down. Therefore, if the rework machine is down, either a bottleneck will occur or rework operators must perform rework manually using conventional soldering techniques.

However, the main problem with the rework station is not its expense but the damage that it causes to the IC components it is trying to attach. Assemblies are routinely damaged due to excessive heat applied during the preheat state of the rework station. Obviously attaching a damaged part, only adds to the time and expense of reworking the board since the damaged part must be removed and replaced with a functional part in order for the printed circuit board to be functional.

The conventional method for reworking a component is by soldering the component onto the PC board by using a soldering iron, such as the Metcal SMT Rework Iron. The problem with using a soldering iron to reattach a component to a PC board is that attachment takes a long time since the rework technician must solder one lead of the component to its corresponding PC board pad at a time. Further, using a soldering iron to attach individual leads to the component to the PC board increases the probability of damage to the leads and the board. During rework using a soldering iron, the component leads and the PC board would be routinely damaged due to the soldering iron tip making physical contact in order to solder the component to the PC board.

A method used for removing a ceramic part is by use of a hot air device, such as a Weller hot air pencil. Typically, the hot air jet device is attached to a stationary structure or boom overhead of the component to be removed. Typically, this process is used for removal for of ceramic components, such as a capacitor. When the hot air flow is initiated, heat is transferred from the heated component to the component leads attached to the component causing the solder to flow. When the solder is molten, the rework technician can remove the part. Because the ceramic component is being removed, any damage caused to the part is not problematic.

A method of efficiently attaching components, including integrated circuit SMT components, to a printed circuit board without causing undue damage to the parts or board is needed.

SUMMARY OF THE INVENTION

The present invention describes an efficient method for attaching computer system components which greatly reduces or eliminates damage to the PC board or components. The method for attaching the computer component includes the steps of: preparing the area of the PC board corresponding to the component to be attached; positioning the component on the PC board so that the component leads are aligned with its corresponding pads on the PC board; electrically coupling the anchoring leads to its corresponding pads on the PC board; and heating the attachment media with a heated air jet so that the heated air jet heats the attachment media to a temperature between the melting point of the attachment media and the vaporization point of the attachment media, wherein the heated air jet is moved back and forth along the edge of the component being attached.

In a first embodiment of the present invention, no external pressure is applied to the component to being electrically coupled or attached to the PC board. In a second embodiment, a downward pressure in the direction towards the printed circuit board is applied to the component while the component is being attached to the printed circuit board. Typically, this downward pressure is applied to the center of the component, preferably using an external tool such as a Penvac. This downward pressure to the component during soldering results in an improved distribution of downward force on each lead so that the connection between the pad and lead is optimum while the IC is being soldered to the PC board.

The present method provides an efficient method for attaching a component to a PCB without damaging the PC or the component. The method described by the present invention provides an efficient method for attaching a component to a PC board. Instead of individually soldering each lead using a soldering iron, the leads are soldered to their corresponding pads on the PC board using a superheated air flow directed at the solder or attachment media. Further, because the present invention does not attach leads individually but en masse, the time required for attachment is reduced. Because the interior leads of the component are not attached individually, rework time required for the technician to attach the component is greatly reduced. For SMT components the time for operator replacement compared to use of a solder gun, is reduced by approximately 75%. In addition, because the attachment method does not require that the nozzle make contact with the assembly, physical damage due to package leads and or gouged surfaces is greatly reduced and is typically eliminated.

In additional advantage of the attachment process recited by the present invention is that it is easy to learn and replicate, thus providing an improved quality consistency in reworked parts between rework technicians. The solder gun reattachment method requires excellent eye hand coordination by the technician. Thus great differences in the quality of the work product can be seen between experienced technicians who have excellent hand eye coordination and those technicians who are less experienced or have average hand eye coordination. Because the present method requires less eye hand coordination, less experienced and those with lower levels of hand eye coordination can typically achieve results as good as experienced rework technicians having excellent hand eye coordination. Solder connections for the method according to the present invention look factory new whereas connections using a soldering gun may have build up of excess solder.

Another advantage of the present invention is cost. Although price of a hot air gun is similar to that of a solder gun, the price is much less than the cost of the laser rework stations. Cost for a hot air gun is approximately $800 while the cost of the laser rework stations is typically in the hundreds of thousands of dollars. Because the cost of the air gun is relatively low, a hot air gun can be placed at the desk of every rework technician.

A further understanding of the nature and advantages of the present invention may be realized with reference to the remaining portions of the specification and the attached drawings.

DETAILED DESCRIPTION OF THE PREFERRED EMBODIMENTS

Figure 6:
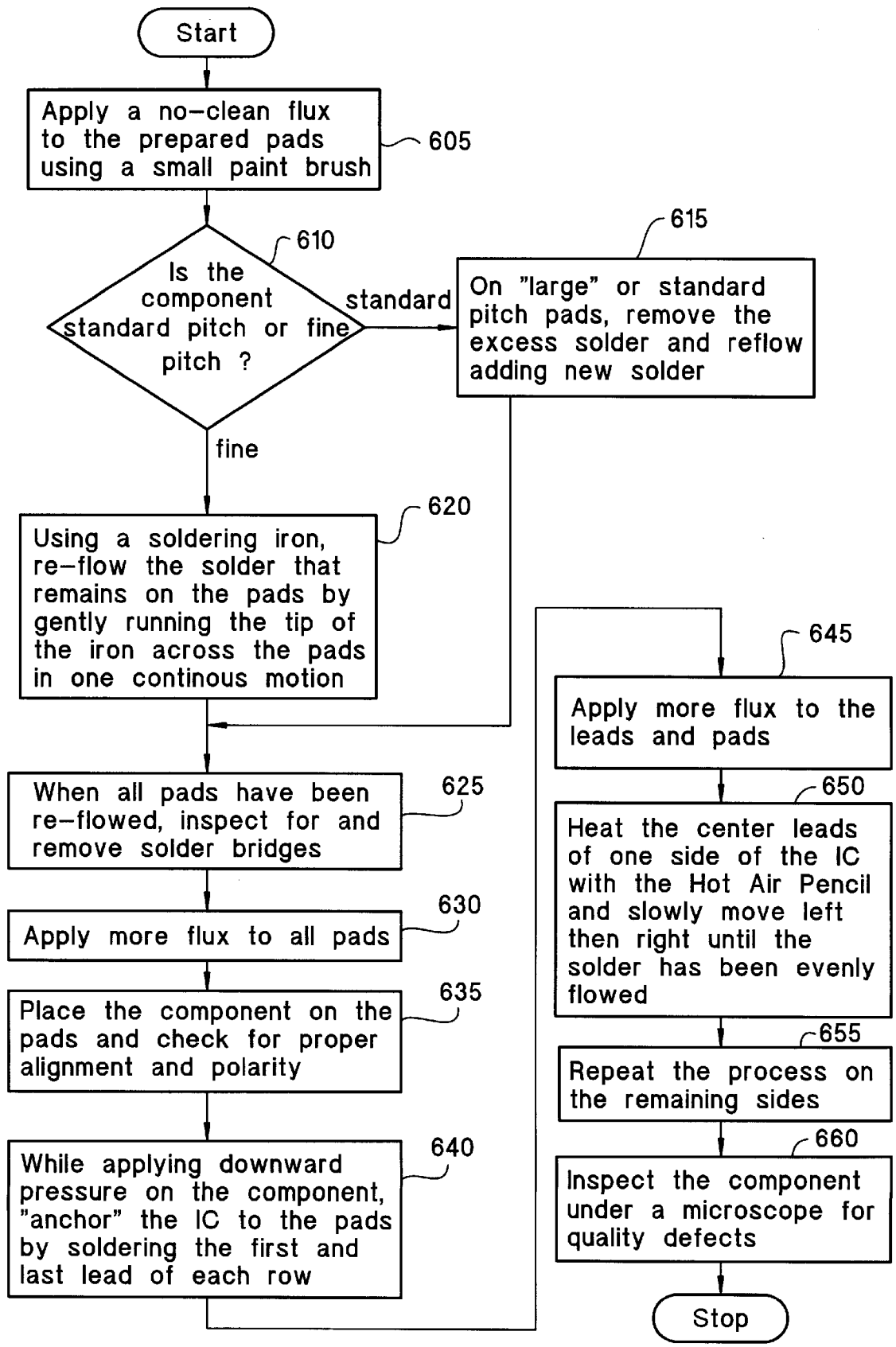
FIG. 6 shows a flowchart of the method of attaching a component according to the present invention.

The present invention provides an efficient method for attaching computer system components to a printed circuit board without damaging the PC board or components. FIG. 6 shows a flowchart of the preferred method of attaching a component according to the present invention. The method includes the steps of: preparing the surface of the PC board corresponding to the component on the PC board; positioning the component on the PC board so that the component leads are aligned with he corresponding pads on the PC board; attaching the anchoring leads to its corresponding pads on the PC board; positioning the hot air gun so that the flow of hot air heats the attachment media; and moving the hot air gun back in forth along the attachment media to provide an even heat flow, until the attachment media reaches it melting point.

The method described by the present invention describes an attachment process that is typically used to attach or electrically couple a part on a reworked PC board. Although the attachment process could theoretically be used for in the original attachment of the typically tens or hundreds of components onto a PC board, typically the attachment of the original component is done en mass using an infared oven to attach all of the components. Thus, the described process is typically used in a rework situation where the technician is attaching a component only after the original defective component has been removed from the PC board. Because the component has been removed before the attachment step, the surface of the PC board is prepared before alignment and attachment of the new component. This is critical because unwanted traces of the attachment media remaining on the board could cause shorts between the pads or cause inferior solder connections.

Figure 1A:
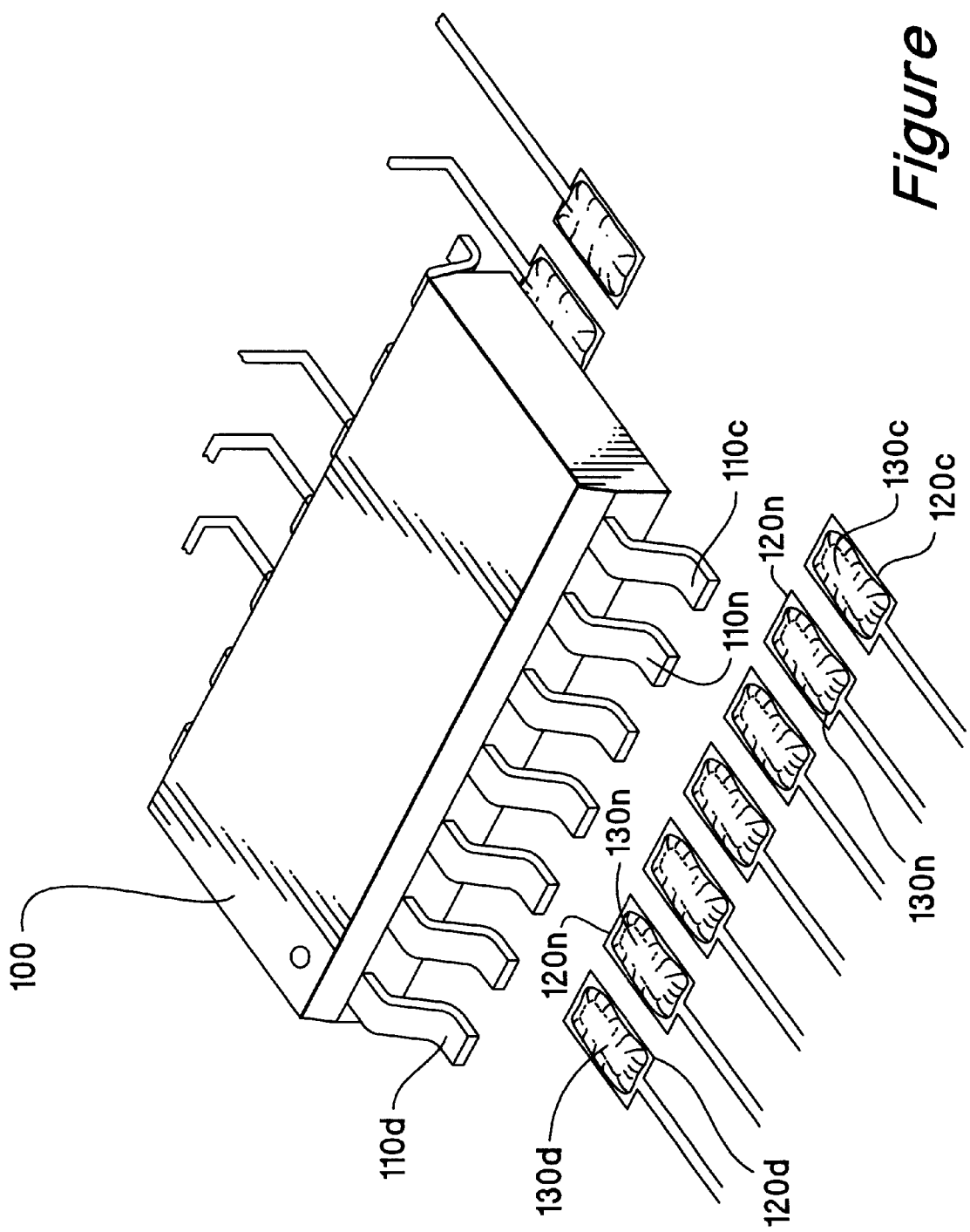
FIG. 1A shows a partial side perspective view of a component before alignment of the component leads to their corresponding pads on the PCB.

For large or standard pitch pads, the PC board is prepared typically by applying flux, removing the excess solder, and reflowing new solder to create the solder bumps shown in FIG. 1A. For fine pitch pads, this preparation is typically be done by reflowing the solder that remains on the pad by gently running the tip of the soldering iron across the pads in one continuous motion to create the solder bumps shown in FIG. 1A. The solder bumps 130 are a build up of the attachment media on the pads 120 of the component 100.

In the preferred embodiment, the first step of preparing the PC board is the application of flux, such as Kester 950E flux, to the PC board in the area where the component is to be removed. The flux is typically applied onto all of the pads or traces of the PC board using a small paint brush. After the application of flux to the PC board pads, the attachment material (typically solder) is reflowed, preferably using a soldering iron. To accomplish this solder reflow, the tip of the soldering iron is tinned and applied to all of the pads on each one side of the component preferably in a single continuous motion. For large pads (typically less than 100 leads), excess solder is preferably removed prior to reflow. For fine pitch and extra fine pitch pads, the excess solder need not be removed prior to reflow. After the solder has been reflowed for all sides of the component, the pads are inspected and any remaining solder bridges are removed. After inspection, the pads are typically cleaned with an alcohol solution.

Figure 1B:
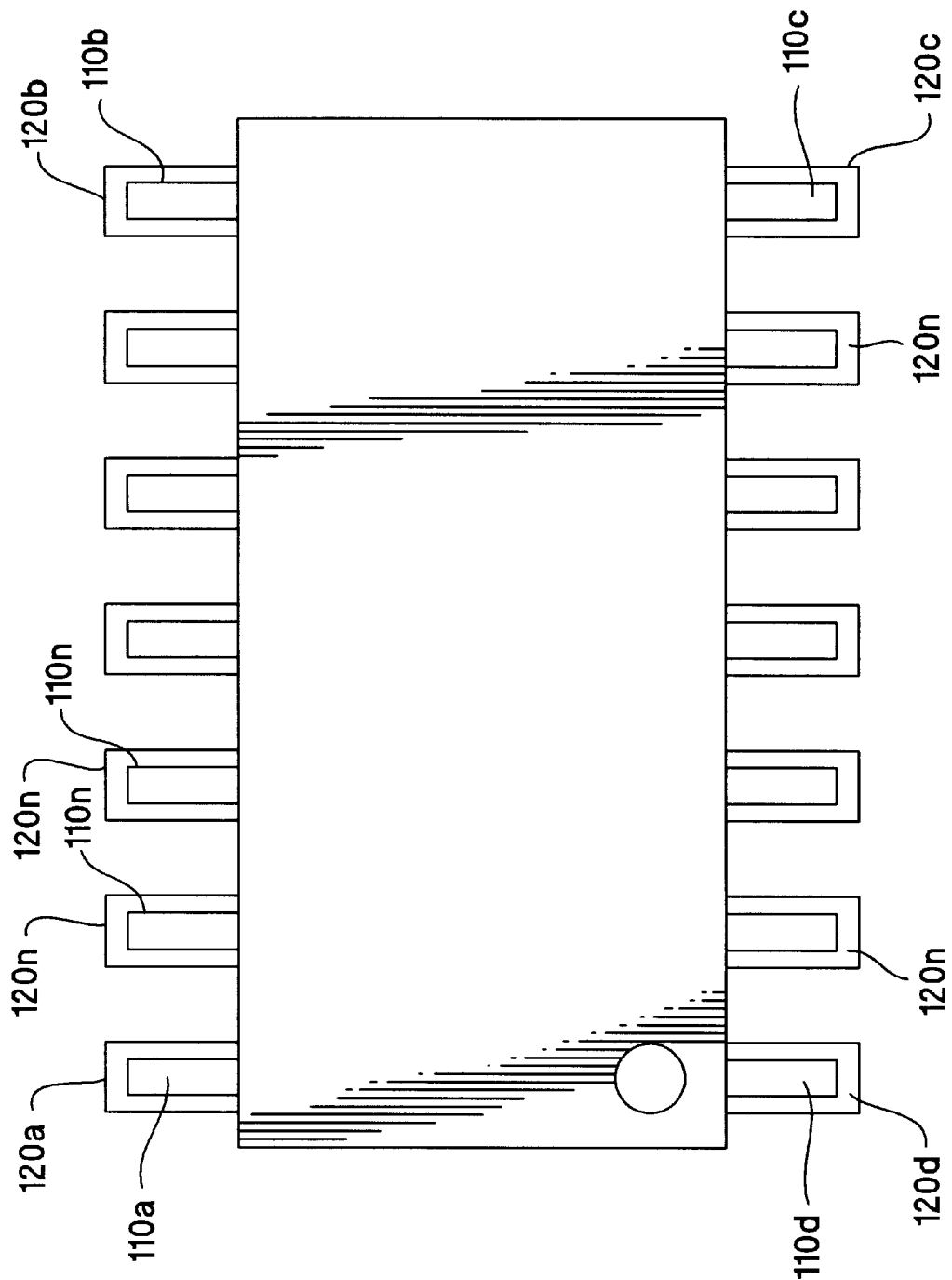
FIG. 1B shows a top view of a partial representation of a component after alignment of the component leads with its corresponding PC board pads but before attachment of the component leads to their corresponding pads on the PCB.

If the area of the PC board where the component is to be attached is free of unwanted solder, the next step in the attachment process is to position the component on the printed circuit board so that the component leads are aligned with its corresponding pads on the printed circuit board. The component leads could also be said to be aligned with the solder bumps formed on the pads since the solder bumps are built up on the pads of PCB. The component leads should be positioned so that they are aligned with their corresponding pads to assure that the leads correspond to their appropriate component signals and that the leads have both proper alignment and polarity. FIG. 1A shows a partial side perspective view of a component 100 before alignment of the component leads 110 to its corresponding pads 120 on the PCB. FIG. 1B shows a top view of a partial representation of a component after alignment of the component leads 110 with its corresponding PC board pads 120 but before attachment of the component leads to their corresponding pads on the PCB 130.

In the preferred embodiment, the anchor leads 110a, 110b, 110c, 110d, for each side of the component are attached to their corresponding pads before attaching the interior leads 110n of the component. Although the anchor leads 110a–d could be attached using a hot air jet to melt or reflow the attachment media, in the preferred embodiment the anchor leads are attached using a soldering iron. After alignment of the component leads 110a–d, 110n to their corresponding pads 120a–d. 120n, preferably a downward pressure is applied to the component 100 using a tool such as a Penvac. The anchor leads 110a–d of the aligned part are then soldered to PC board using conventional soldering techniques. Although not required, the downward mechanical pressure, helps to assure that any gaps between the anchor leads and their corresponding pads are eliminated, ensuring a good connection. Preferably, after attachment of the anchor leads, flux is once more applied to remove any stray solder that occurs during the anchor lead attachment step.

Figure 2:
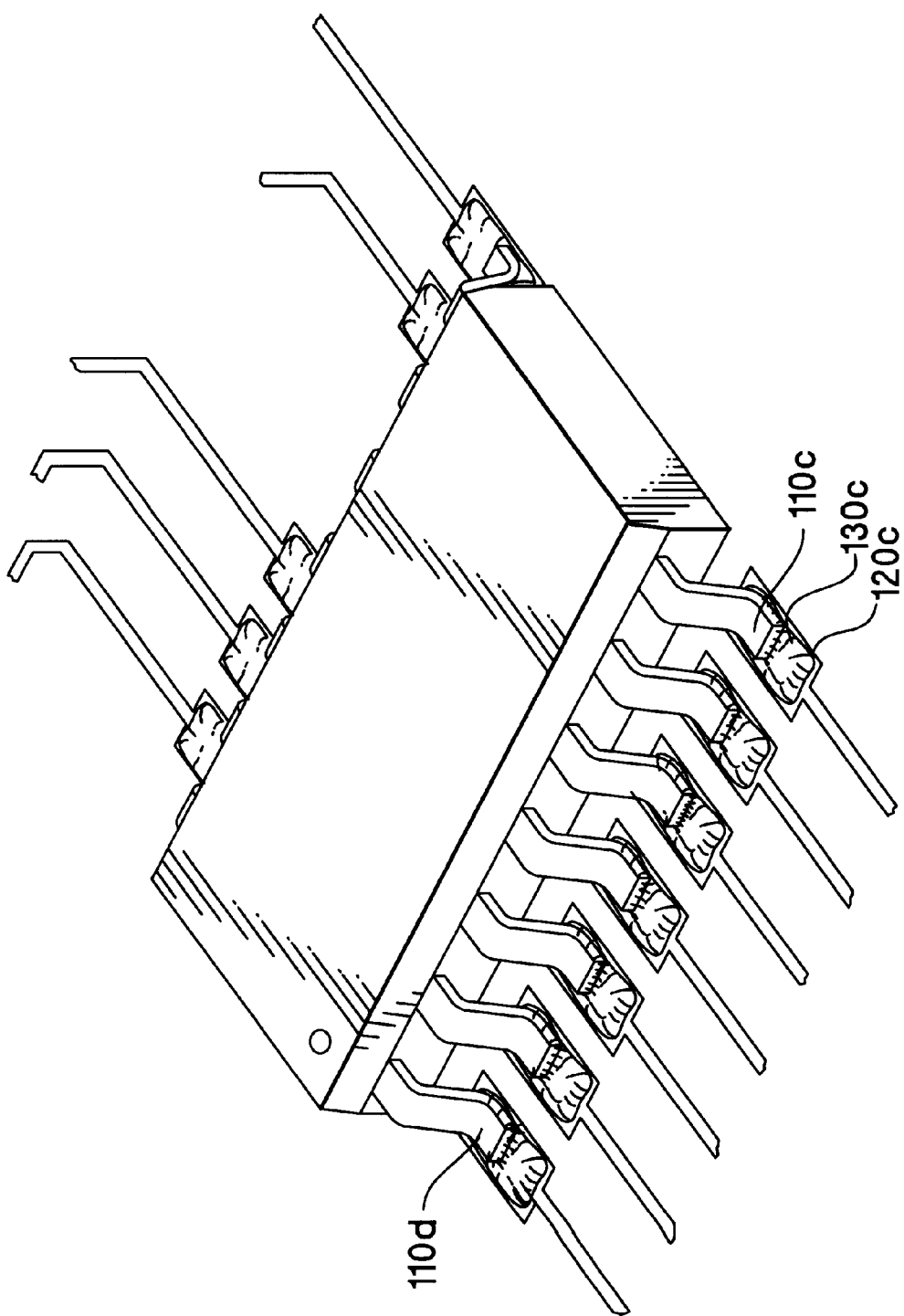
FIG. 2 shows a partial side view of a component after the steps of attachment of the anchor leads of the component to their corresponding pads on the PC board.

FIG. 2 shows a partial side view of a component after the steps of attachment of the anchor leads of the component to their corresponding pads on the PC board. After the attachment of the anchor leads 110a–d, the interior leads 110n of the component are attached to their corresponding pads using a heated air flow method.

In the preferred embodiment, the interior leads 110n are attached using the heated air jet. However, the heated air jet is typically moved over the area of the previously attached anchor leads to smooth out the solder connection. In an alternative embodiment all of the component leads (both anchor 110a–h and interior 110n) are attached using the heated air flow. Attaching the anchor leads prior to attaching the interior leads is preferred since (1) it typically results in a superior alignment of the component and (2) it allows the rework technician to not worry about the component alignment while using one hand to hold the heated air jet source while the other hand is used to apply a downward pressure to the component.

Figure 3:
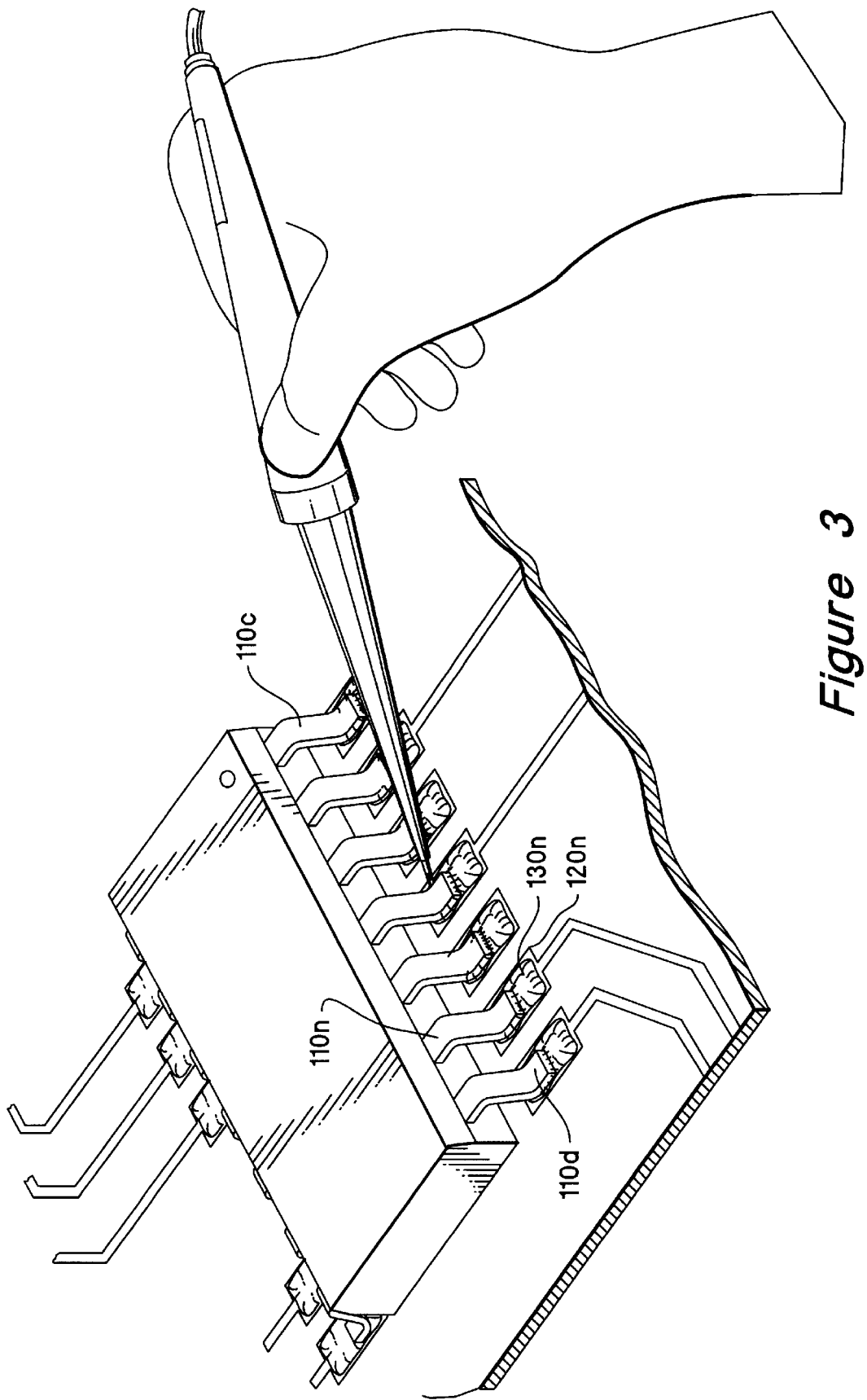
FIG. 3 shows a partial side view of the component and hot air jet device positioned to heat the attachment media (solder bumps) on the pads of the PC board.

The heated air jet is positioned so that it heats the attachment media. FIG. 3 shows a partial side view of the component and hot air jet device positioned to heat the attachment media (solder bumps) formed on the pads of the PC board. In the preferred embodiment, the heated air jet is provided via a heated air flow device, such as the Weller air pencil. Typically, the heated air flow device forces the heated air jet or stream through a nozzle to increase the speed of the air flow. The temperature of the heated air flow should be above the melting point temperature of the attachment media and below the vaporization temperature of the attachment media to avoid lead vapor. In the preferred embodiment, the temperature of the hot air flow is approximately 900 degrees Farenheit. For the Weller hot air pencil, the air flow knob is preferably set to 10.

Figure 4:
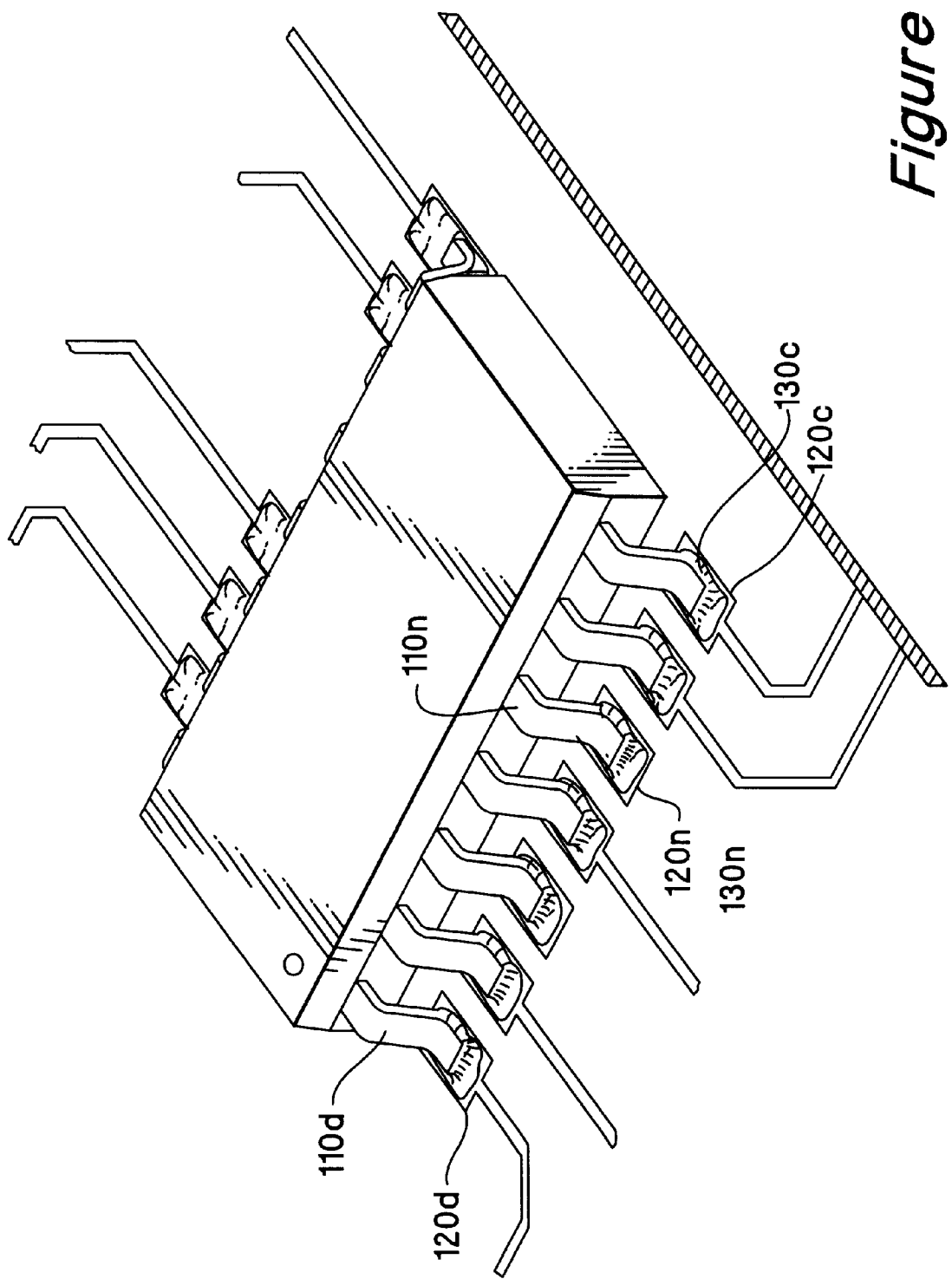
FIG. 4 shows a partial side view of a packaged component after attachment of the component leads by reflowing the attachment media.

After the forced air flow is heated within the desired temperature range, the heated air jet is moved along the attachment media, until the solder melting point temperature is reached. In one embodiment, the heated air jet is moved slowly along the attachment media in one continuous motion without reversing direction. However, in the preferred embodiment, the heated air jet is moved slowly back and forth along the side of the component being heated. This results in a more even distribution of heat so that the solder is more evenly flowed, providing a superior connection. FIG. 4 shows a partial side view of a packaged component after attachment of the component leads by reflowing the attachment media. Unlike conventional methods where the leads are attached individual, in the hot air method described by the present invention, an entire side of interior leads is attached at the same time.

Figure 5A:
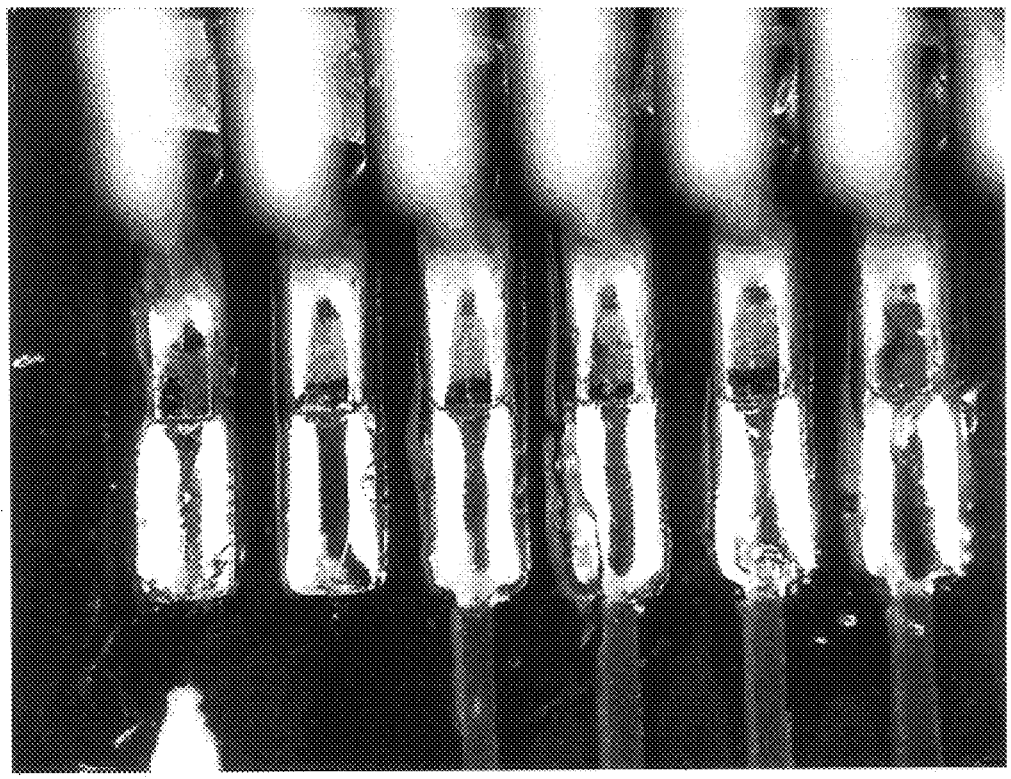
FIG. 5A shows a photograph of the component leads (magnification factor 25×) where the component leads are attached using a soldering iron.
Figure 5B:
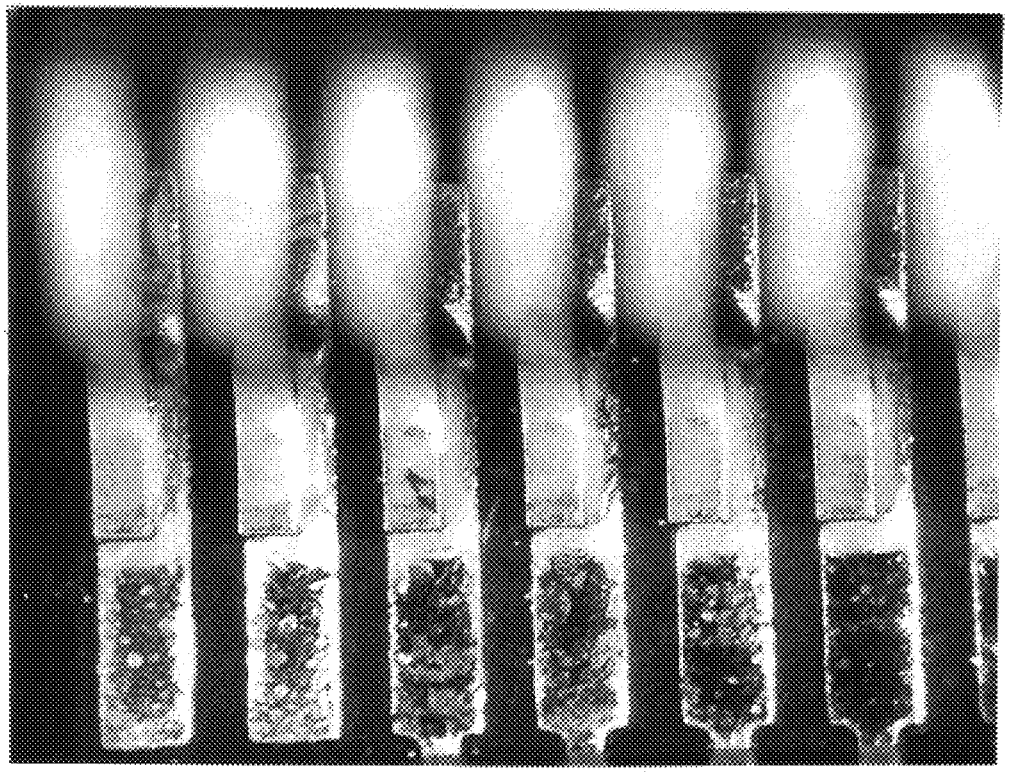
FIG. 5B shows a photograph of the component leads (magnification factor 25×) where the component has been attached to the PC board according to the method of the present invention.

FIG. 5A shows a photograph of the component leads (magnification factor 25×) where the component leads are attached using a soldering iron. FIG. 5B shows a photograph of the component leads (magnification factor 25×) where the component has been attached to the PC board according to the method of the present invention. Both FIGS. 5A and 5B exhibit excellent quality solder joints. However, the hand soldered part shown in FIG. 5A shows a build-up of excess solder around the pad area not covered by the leads.

In one embodiment of the present invention, no external pressure is applied to the component during the step of moving the heated air jet stream along the attachment media. Although this method works well, typically applying a downward pressure to the component while attaching the component results in a more secure connection by reducing or eliminating any gaps between the leads and the pads on the PC board. This downward pressure to the component during soldering results in an improved distribution of downward force on each lead so that the connection between the pad and lead is optimum while the IC is being soldered to the PC board.

In a second preferred embodiment, a downward pressure is applied to the component in the direction towards the printed circuit board while the component is being attached to the printed circuit board. The applied external pressure should not result in undue stresses being applied to the chip which could result in damage to the component. A vacuum tool, such as a Penvac, helps to secure the component without damaging it. In one embodiment, this downward pressure is applied to the center of the component. In a second alternative embodiment, this downward force is applied to the side of the component that is currently being attached. After the process is complete, the component should be inspected for proper solder integrity.

It is understood that the above description is intended to be illustrative and not restrictive. The scope of the invention should therefore be determined with reference to the appended claims, along with the full scope of equivalents to which such claims are entitled.

What is claimed is:

1. A method for attaching a component to a printed circuit board, the method including the steps of:
    (a) manually positioning the component, wherein the component includes both a plurality of anchoring leads and a plurality of interior leads, on the printed circuit board so that the plurality of anchoring leads and plurality of interior leads of the component are aligned with their corresponding pads on the printed circuit board;
    (b) attaching the plurality of anchoring leads to their corresponding pads on the printed circuit board; and
    (c) attaching the plurality of interior leads of the component to their corresponding pads on the printed circuit board by heating an attachment media by manually moving a heated air jet device along the plurality of interior leads of the component and the attachment media so that a heated air jet flowing from the heated air jet device heats the attachment media to a temperature between the melting point of the attachment media and the vaporization point of the attachment media.

2. The method recited in claim 1 wherein the heated air jet is moved back and forth along the attachment media.

3. The method recited in claim 1 wherein the heated air jet is moved slowly along the attachment media in one continuous motion without changing direction.

4. The method recited in claim 1 wherein the steps of positioning the attachment media and attaching the at least interior leads of the component with a heated air jet are repeated for each side of the component.

5. The method recited in claim 1 wherein during the step of attaching the plurality of interior leads of the component, a downward pressure is applied to the component using a tool held in one hand of a technician while the other hand of the technician is used to move the heated air jet device.

6. The method recited in claim 5 wherein the downward pressure is applied to the center of the component.

7. The method recited in claim 5 wherein the tool used for applying downward pressure is a vacuum pressurized device.

8. The method recited in claim 5 wherein the downward pressure is applied to the edge of the component that is currently being attached to the printed circuit board.

9. The method recited in claim 1 further including the step of removing any traces of attachment media from the pads on the printed circuit board corresponding to the component, wherein the step of removing any traces of the attachment media is performed before the step of manually positioning the component on the printed circuit board.

* * * * *